United States Patent
Hong et al.

(10) Patent No.: US 7,196,923 B1
(45) Date of Patent: Mar. 27, 2007

(54) BITCELL LAYOUT

(75) Inventors: Joseph Hong, Chandler, AZ (US);
Rabiul Islam, Austin, TX (US);
Subodh Annojvala, Chandler, AZ (US);
Lloyd Briggs, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/241,390

(22) Filed: Sep. 30, 2005

(51) Int. Cl.
*G11C 5/06* (2006.01)

(52) U.S. Cl. .................... 365/63; 365/51; 365/154; 365/230.05; 257/903

(58) Field of Classification Search ............ 365/51, 365/63, 154, 203.05; 257/903
See application file for complete search history.

(56) References Cited

U.S. PATENT DOCUMENTS

| | | | |
|---|---|---|---|
| 5,698,873 A | 12/1997 | Colwell et al. | 257/206 |
| 6,734,573 B2 | 5/2004 | Okada | 257/903 |
| 2006/0067108 A1 | 3/2006 | Islam | 365/164 |
| 2006/0072356 A1 | 4/2006 | Islam et al. | 365/154 |

*Primary Examiner*—Hoai V. Ho
(74) *Attorney, Agent, or Firm*—Konrad Raynes & Victor, LLP; Alan S. Raynes

(57) ABSTRACT

Bitcell layouts for use in electronic devices and systems are described. One embodiment relates to a memory including at least one bitcell, the bitcell including a storage cell region and a read channel region. The storage cell region is substantially L-shaped and includes six transistors. The read channel region is shaped to fit together with the substantially L-shaped storage cell region to form a substantially rectangular bitcell shape. Other embodiments are described and claimed.

22 Claims, 5 Drawing Sheets

BITCELL LAYOUT

RELATED ART

As electronic devices continue to shrink, advanced process technologies place severe restrictions on transistor layout to ensure manufacturability and performance. For example, design rules for single layer polysilicon device layout may include limitations including, but not necessarily limited to, the routing, spacing, width, and length of wiring lines, vias, interconnects, and other structures formed in the electronic device. Such design rules are typically imposed to obtain devices having the desired specifications for area, timing, power, and yield. Unfortunately, to enhance certain specifications often leads to degradation of other specifications. For example, decreasing area may lead to decreased yield due to processing difficulties caused by the decreased area. As a result, a balancing of the various specifications is carried out to obtain acceptable devices. This is particularly so for process technologies in the sub-100 nm region.

One example of a bitcell is known in the art as a 1R+1W bitcell design (where R stands for read and W stands for write). Such a bitcell is often used as a multi-port memory (for example, as a register file) bitcell in integrated circuit design. The 1R section is known as the read channel section of the bitcell, and the 1W section is known as the storage cell section of the bitcell. The transistors may have different sizes, and due to the asymmetry in the transistors within the cell and the imposition of design rules such as discussed above, it is difficult to create an efficient, compact bitcell layout.

The 1R+1W bitcell may have a 6T+2T configuration (6 transistor+2 transistor), with 6 transistors in the storage cell section and 2 transistors in the read channel section. A generalized bitcell structure 10 is illustrated in FIG. 1, in which the transistors in the storage cell section 12 are clustered together and then the transistors in the read channel section 14 are clustered together in an adjoining area to the side of the entire storage cell section 12.

BRIEF DESCRIPTION OF THE DRAWINGS

Embodiments are described by way of example, with reference to the accompanying drawings, which are not drawn to scale, wherein.

DETAILED DESCRIPTION

Figure 2:
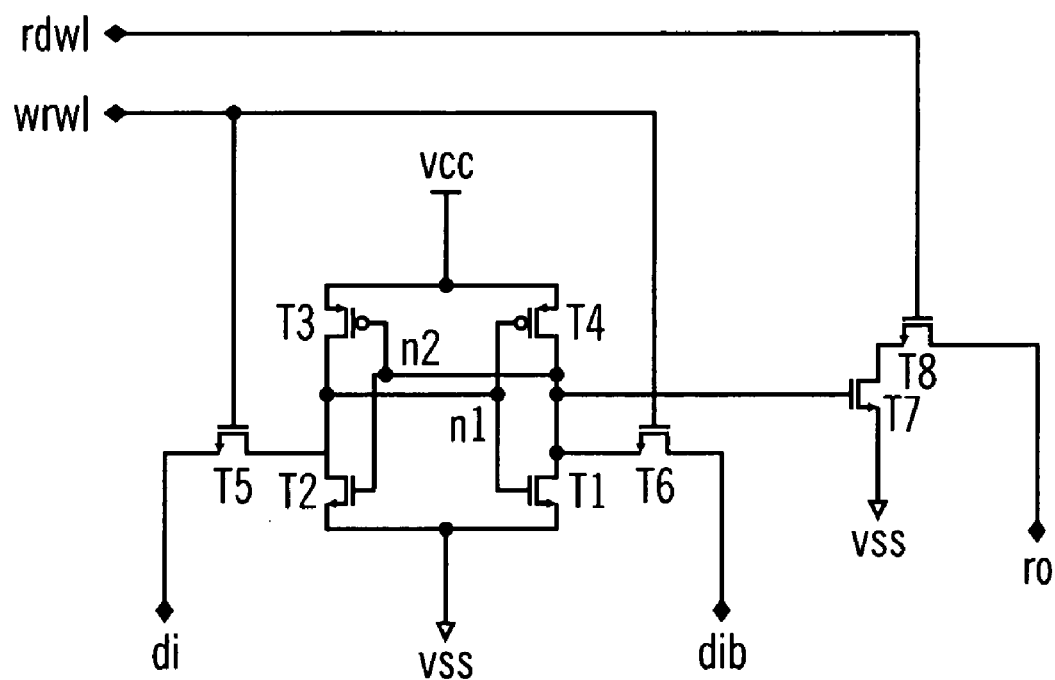
FIG. 2 illustrates an electrical schematic of a bitcell, in accordance with certain embodiments.

FIG. 2 is a schematic of electrical connections for a bitcell such as a register file bitcell, having eight transistors. The schematic in FIG. 2 illustrates the electrical connections and not the actual physical layout (spacing, size, etc.) of the transistors. Such electrical connections may be used in certain embodiments described herein. FIG. 2 illustrates six transistors T1–T6 of the storage cell section, and two transistors T7–T8 of the read channel section. The transistors may be conventional field effect transistors including a gate and source/drain regions. At the top of FIG. 2 are the read word line (rdwl) and the write word line (wrwl). Coupled to the transistor T5 is the data in (di) line and coupled to transistor T6 is the data in bar (dib) line. Coupled to transistor T8 is the read out (ro) line. Nodes (n1 and n2), power (vcc), and ground (vss) lines are also shown. The 6T+2T organization can be readily observed. The 2T read channel section may use larger transistors than the 6T storage cell section, for good read performance. It should be noted that the storage cell transistors may also vary in size, according to standard memory cell design practice.

Figure 1:
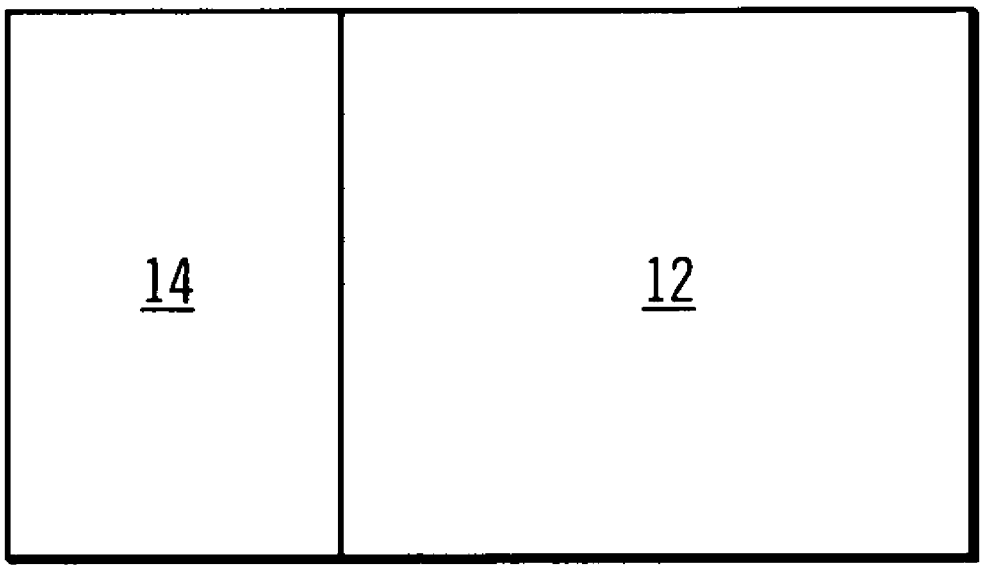
FIG. 1 illustrates a generalized layout of a storage cell section and a read section of a bitcell.

Certain embodiments described herein relate to an efficient, compact layout of a bitcell. Such a bitcell may in certain embodiments be used as a register file bitcell. The layout reconfigures the transistors away from the known organization of clustering the storage cell section and then appending the read channel section to the side of the entire storage cell section as in FIG. 1. Instead, the storage cell section extends around part of the read channel section to shorten signal paths and improve area efficiency. As a result, this cell is more compact and has an improved density. When this bitcell is arrayed out, a relatively regular and uniform pattern is obtained, which is advantageous for manufacturability. One example of such a bitcell layout is illustrated in FIG. 3.

Figure 3:
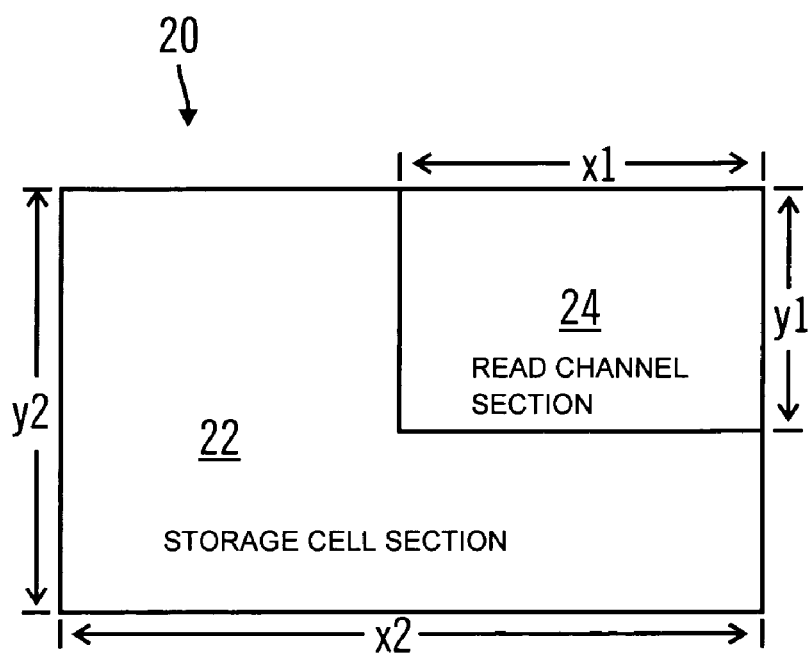
FIG. 3 illustrates a top view layout of a bitcell having a storage cell section and a read section, in accordance with certain embodiments.

FIG. 3 illustrates a top view bitcell layout 20 including the relative positions of the storage cell section and the read channel section. As seen in FIG. 3, the storage cell section 22 is wrapped around a portion of the read channel section 24, in order to shorten signal paths and improve area efficiency. This layout leads to superior density for memories utilizing such a 1R+1W bitcell. The storage cell section 22 as illustrated in FIG. 3 has a substantially L-shaped arrangement. The read channel section 24 as illustrated in FIG. 3 has a substantially rectangular shape that fits into the open region defined by the L shape of the storage cell section.

Another way to describe the relative size of the storage cell section 22 and reach channel section 24 is that a dimension x2 of the storage cell section 22 is greater than a dimension x1 of the read channel section 24, and a dimension y2 of the storage cell section 22 is greater than a dimension y1 of the read channel section 24.

Figure 4:
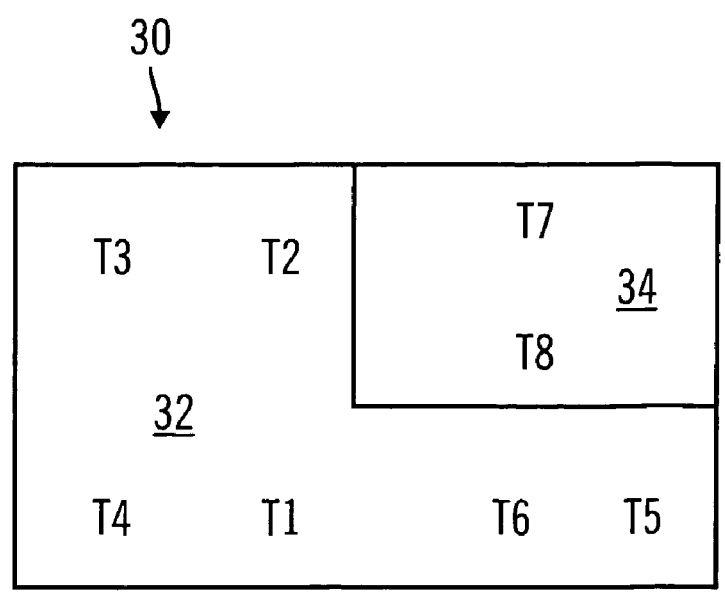
FIG. 4 illustrates a top view layout of a bitcell including the relative position of the transistors within the storage cell section and the read section, in accordance with certain embodiments.

FIG. 4 illustrates an example of an embodiment of a bitcell 30 showing the relative locations of the transistors, with the transistors being positioned in a storage cell section 32 and the read channel section 34 similar to those illustrated in FIG. 3. More specifically, as illustrated in FIG. 4, two transistors, T3 and T2, are positioned in an upper portion of the L-shaped storage cell section 32. Two transistors, T4 and T1, are positioned in a lower portion of the L-shaped storage cell section 32. At least a portion of each of transistors T1 and T2 is positioned along a line (in a vertical direction as illustrated in FIG. 4), and at least a portion of each of transistors T1 and T4 is positioned along a line (in a horizontal direction as illustrated in FIG. 4). Likewise, at least a portion of each of transistors T4 and T3 is positioned along a line (in a vertical direction as illustrated in FIG. 4). The transistors T6 and T5 are positioned in a lower right hand portion of the L-shaped storage cell section. At least a portion of each of the transistors T6 and T5 is positioned along the same line (in a horizontal direction as illustrated in FIG. 4) as transistors T1 and T4. Read channel region 34 includes transistors T7 and T8, with at least a portion of transistor T7 positioned along the same line (in a horizontal direction as illustrated in FIG. 4) as transistors T3 and T2. In addition, at least a portion of transistors T7 and T8 are positioned along a line (in a vertical direction as illustrated in FIG. 4) with transistor T6. In the embodiment illustrated in FIG. 4, the lines described above as in a horizontal direction are orthogonal to the lines described above as in a vertical direction, the lines in the horizontal direction are parallel to each other, and the lines in the vertical direction are parallel to each other. In other embodiments, the transistors may be positioned along lines that intersect at angles other than orthogonal or parallel.

Certain embodiments may also include bitcells having more or less than 8 transistors, having a similar layout with a substantially L-shaped storage cell section and a read channel region that fits together with the storage cell section in a manner such as that shown in FIG. 3, for example.

In addition, certain embodiments, when viewed from above, may also be described as having a 2×2 array including transistors positioned in each of an upper left, upper right, lower left, and lower right portion of the 2×2 array. For example, the embodiment illustrated in FIG. 4 includes at least part of transistors T7 and T8 in the upper right portion, transistors T3 and T2 in the upper left portion, transistors T4 and T1 in the lower left portion, and transistors T6 and T5 in the lower right portion of the 2×2 array.

Figure 5:
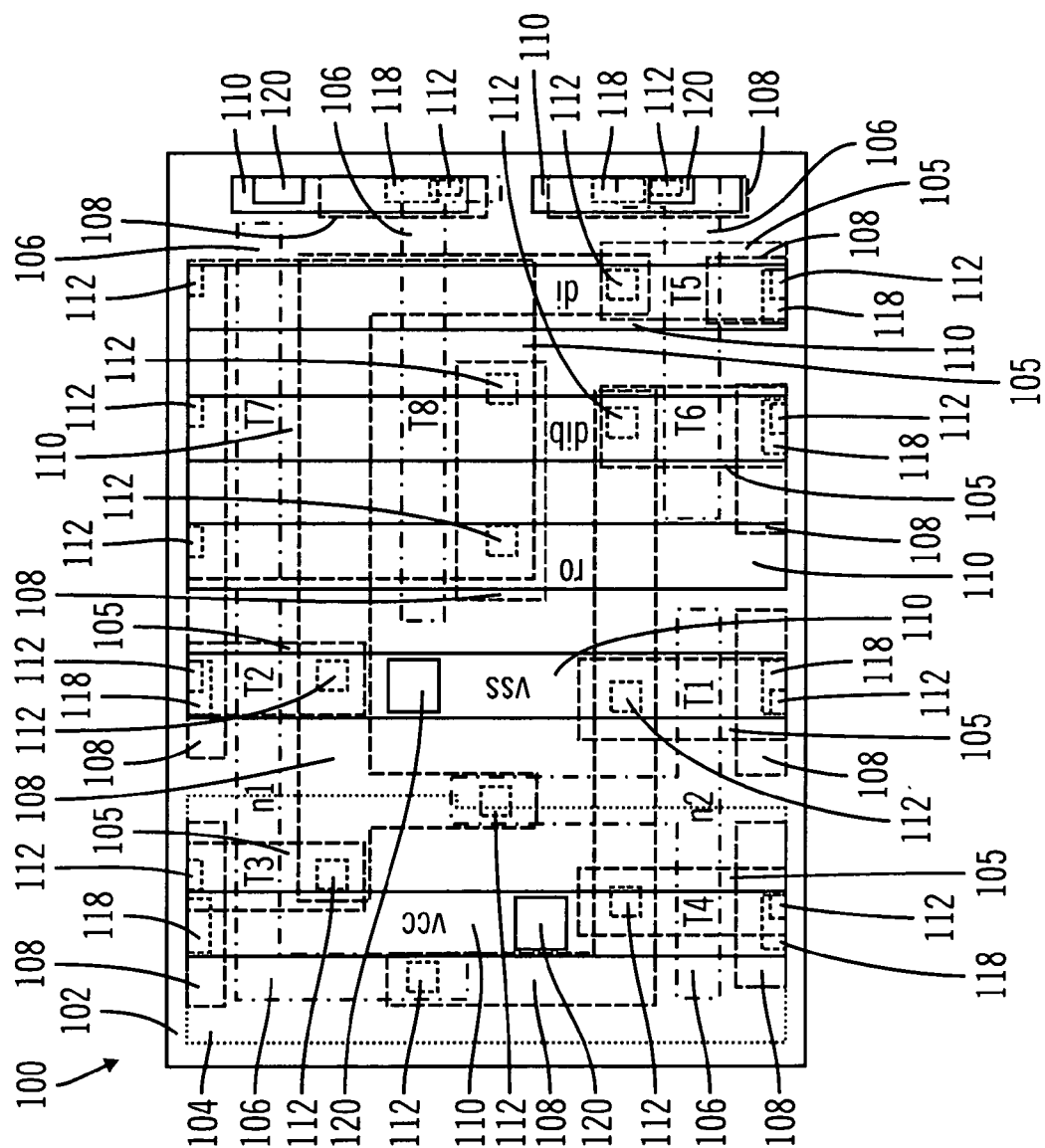
FIG. 5 illustrates a top view of certain layers in a bitcell having a transistor layout similar to that illustrated in FIG. 4, in accordance with certain embodiments.

FIG. 5 illustrates a more detailed view of a bitcell structure 100 having a transistor layout similar to that of FIG. 4, including various layers in the structure in accordance with one embodiment. For clarity, the view illustrated in FIG. 5 omits certain layers known to be included in transistor structures in known locations, including, but not necessarily limited to, gate oxide layer, oxide spacers, and interlayer dielectric. FIG. 5 also shows the relative location of the eight transistors as seen in FIG. 4. The bitcell of FIG. 5 has a 6T+2T structure with electrical connections such as those illustrated in FIG. 2.

The bitcell structure 100 includes a semiconductor substrate 102 having an n-well region 104 implanted therein. The substrate also includes diffusion regions 105. The n-well region 104 is bounded by small dotted lines. The diffusion regions 105 are bounded by alternating longer and shorter dashed lines, with seven diffusion regions 105 illustrated in FIG. 5. FIG. 5 illustrates four polysilicon gate layer regions 106, bounded by alternating dotted and dashed lines. Nodes n1 and n2 are also shown. First metal layer regions 108 and second metal layer regions 110 are also illustrated, with the first metal layer regions 108 bounded by dashed lines and the second metal layer regions 110 bounded by solid lines. The second metal layer regions 110 include power (vcc), ground (vss), read out (ro), data in (di), and data in bar (dib) lines.

A plurality of contact vias between various of the layers are also present in FIG. 5. Contact vias 112 are formed between the diffusion regions 105 in the semiconductor substrate 102 and the first metal layer regions 108, or between the polysilicon regions 106 and the first metal layer regions 108, with the contact vias 112 being bounded by short dashed lines. Contact vias 118 are formed between first metal layer regions 108 and second metal layer regions 110, with the contact vias 118 being bounded by short dashed lines. Contact vias 120 are formed between second metal layer regions 110 and third metal layer regions (not shown), with the contact vias 120 being bounded by solid lines.

The relative positions of the transistors T1–T8 are also illustrated in FIG. 5. The labels T1–T8 are positioned over the gate portion of the transistor. Transistors T3, T2, and T7 are positioned so that a line (in the horizontal direction as illustrated in FIG. 5) contacts at least part of each of these transistors. Similarly, transistors T4, T1, T6, and T5 are positioned so that a line (in the horizontal direction as illustrated in FIG. 5) contacts at least part of each of these transistors. It should also be noted that in certain embodiments, the transistors T5 and T6 may be slightly larger than the other storage cell transistors (T1–T4).

In addition, the transistors T3 and T4 are positioned so that a line (in the vertical direction as illustrated in FIG. 5) contacts at least part of each of these transistors. The transistors T2 and T1 are also positioned so that a line (in the vertical direction as illustrated in FIG. 5) contacts at least part of each of these transistors. The transistors T7, T8, and T6 are also positioned so that a line (in the vertical direction as illustrated in FIG. 5) contacts at least part of each of these transistors.

Certain embodiments utilize arrays of bitcells having a structure such as that illustrated in FIG. 5, to form, for example, memory such as RAM (random access memory) that is used as a register file. When arrayed in a group of 8 rows and 8 columns of the bitcell structure of FIG. 5, for example, the bitcell pattern is relatively uniform and regular, which is advantageous for manufacturing and for predicting performance.

Certain embodiments using a bitcell layout as described above may include memories for a variety of chip designs including, but not limited to, processors, chipsets, ASIC's (application specific integrated circuits), and SOC's (system on a chip). Embodiments are applicable for advanced process technologies of the sub-100 nm region, including 90 nm and below.

Embodiments may also relate to methods for forming a bitcell. A plurality of transistors in a storage cell section may be positioned in a substantially L-shaped arrangement, for example, the arrangement illustrated in FIGS. 3–5. A plurality of transistors in a read channel section are positioned within the region defined by the L-shape of the storage cell section, so that together the storage cell section and the read cell section are formed to have a substantially rectangular shape.

Figure 6:
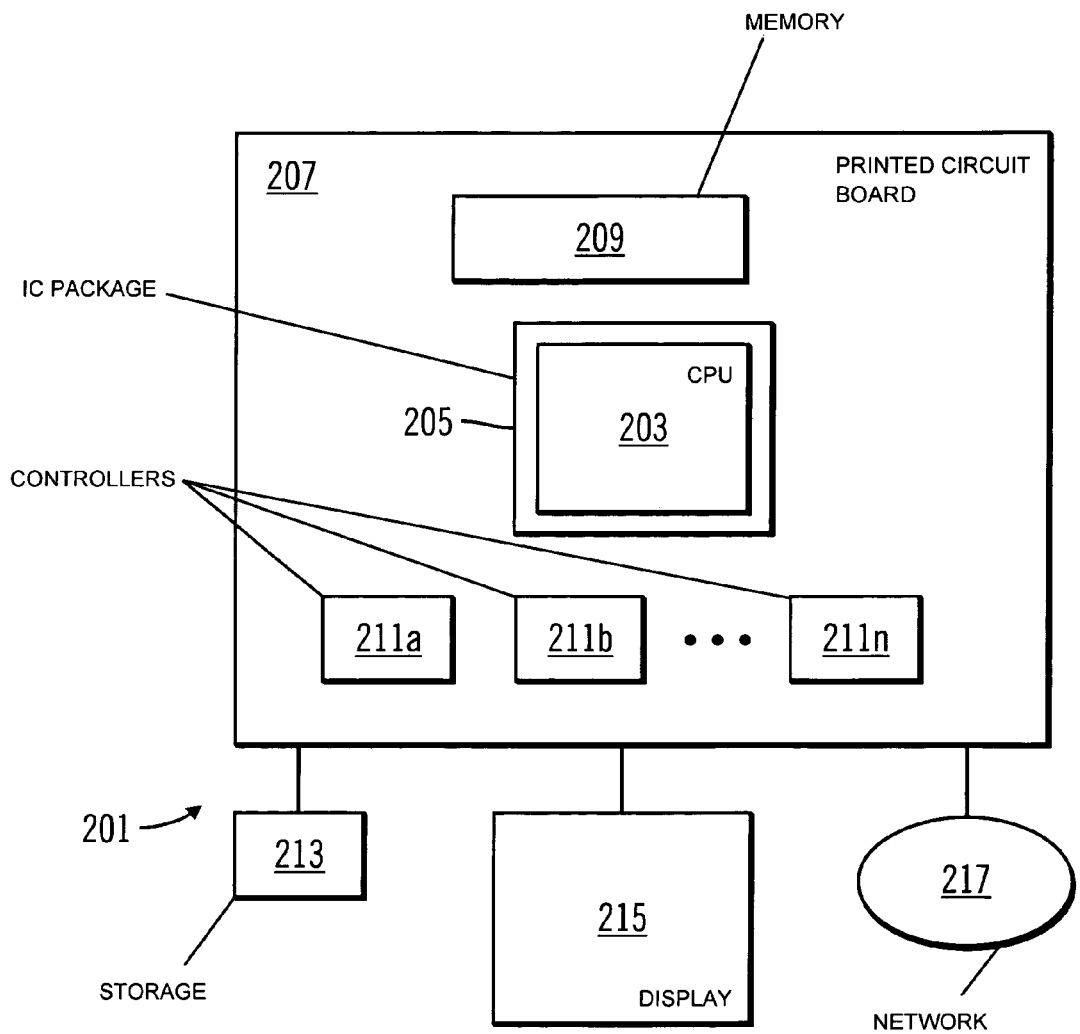
FIG. 6 illustrates an electronic system arrangement in which embodiments may find application.

FIG. 6 schematically illustrates one example of an electronic system environment in which aspects of described embodiments may be embodied. Other embodiments need not include all of the features specified in FIG. 6, and may include alternative features not specified in FIG. 6.

The system 201 of FIG. 6 may include at least one central processing unit (CPU) 203. The CPU 203, also referred to as a microprocessor, may be attached to an integrated circuit package 205, which is then coupled to a printed circuit board 207, which in this embodiment, may be a motherboard. The CPU 203 is an example of an electronic device that may include a plurality of bitcells (such as register file bitcells) having a structure in accordance with embodiments such as described above and illustrated in FIGS. 3–5.

The system 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, an MP3 (moving picture experts group layer-3 audio) player), PDA (personal digital assistant) telephony device (wireless or wired), network appliance, virtualization device, storage controller, network controller, etc.

The controllers 211a, 211b . . . 211n may include a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. A memory, comprising:
   at least one bitcell including a storage cell region and a read channel region;
   the storage cell region being substantially L-shaped and having six transistors; and
   the read channel region shaped to fit together with the substantially L-shaped storage cell region to form a substantially rectangular bitcell shape;
   wherein the substantially L-shaped storage cell region extends around two sides of the read channel region.

2. The memory of claim 1, wherein the read channel has two transistors.

3. The memory of claim 2, wherein a first transistor and a second transistor of the storage cell region, and a first transistor of the read channel region, are positioned along a first line.

4. The memory of claim 3, wherein a second transistor of the read channel region is positioned along a second line orthogonal to the first line.

5. The memory of claim 4, wherein a third, a fourth, a fifth, and a sixth transistor of the storage cell region are positioned along a third line parallel to the first line.

6. The memory of claim 5, wherein one of the third, fourth, fifth, and sixth transistors of the storage cell region is also positioned along the second line.

7. A system, comprising:
   at least one device selected from the group consisting of a processor, a chipset, an ASIC, and an SOC;
   the device including a memory, the memory comprising at least one bitcell including a storage cell region and a read channel region, the storage cell region being substantially L-shaped and having six transistors, the read channel region shaped to fit together with the substantially L-shaped storage cell region to form a substantially rectangular bitcell shape, wherein the substantially L-shaped storage cell region extends around two sides of the read channel region; and
   a video controller.

8. The system of claim 7, wherein the read channel has two transistors.

9. The system of claim 8, wherein a first transistor and a second transistor of the storage cell region, and a first transistor of the read channel region, are positioned along a first line.

10. The system of claim 9, wherein a second transistor of the read channel region is positioned along a second line orthogonal to the first line.

11. The system of claim 10, wherein a third, a fourth, a fifth, and a sixth transistor of the storage cell region are positioned along a third line parallel to the first line.

12. The system of claim 11, wherein one of the third, fourth, fifth, and sixth transistors of the storage cell region is also positioned along the second line.

13. A bitcell structure comprising:
   a storage cell region and a read channel region, wherein the storage cell region and the read channel region are configured in a 2×2 array including an upper left portion, an upper right portion, a lower left portion, and a lower right portion;
   the storage cell region including two transistors each at least partially positioned in the upper left portion, two transistors each at least partially positioned in the lower left portion, and two transistors each at least partially positioned in the lower right portion of the 2×2 array; and
   the read channel region including two transistors each at least partially positioned in the upper right portion of the 2×2 array.

14. A bitcell structure as in claim 13, wherein at least a part of each of the two transistors in the upper left portion is positioned along a first horizontal line, wherein at least a part of each of the two transistors in the lower left portion is positioned along a second horizontal line parallel to the first horizontal line, wherein at least a part of each of the two transistors in the lower right portion is also positioned along the second horizontal line, and wherein at least a part of each of the two transistors in the upper right portion is positioned along a third line orthogonal to the first horizontal line and the second horizontal line.

15. A bitcell structure as in claim 14, wherein at least a part of one of the transistors in the lower right portion is positioned along the third line.

16. A bitcell structure as in claim 13, wherein at least part of each of the two transistors in the upper left portion and at least part of one of the transistors in the upper right portion are positioned along a first line.

17. A bitcell structure as in claim 16, wherein at least part of each of the two transistors in the upper right portion and at least part of one transistor in the lower right portion are positioned along a second line orthogonal to the first line.

18. A bitcell structure as in claim 13, wherein at least one of the transistors in the read channel region has a size that differs from that of at least one of the transistors in the storage cell region.

19. A bitcell structure as in claim 13, wherein the number of transistors in the storage cell region is six and the number of transistors in the read channel region is two.

20. A bitcell structure having a rectangular shape, comprising:
   a storage cell region and a read channel region, the storage cell region being substantially L-shaped and including a maximum length and a maximum width;
   wherein a maximum length of the bitcell structure is equal to the maximum length of the storage cell region;
   wherein a maximum width of the bitcell structure is equal to the width of the storage cell region; and
   wherein the read channel region fits within an open region defined by the substantially L-shaped storage cell region.

21. A bitcell structure as in claim 20, wherein the storage cell region has 6 transistors and the read channel region has 2 transistors;
   wherein a first transistor and a second transistor in the storage cell region, and a first transistor in the read channel region, are positioned along a first line;
   wherein a third, a fourth, fifth and a sixth transistor in the storage cell region are positioned along a second line, the second line parallel to the first line and spaced a distance away from the first line; and
   wherein a second transistor in the read channel region is positioned along a third line orthogonal to the first line.

22. A bitcell structure as in claim 21, wherein the first and second transistors in the read channel region, and one of the third, fourth, fifth and sixth transistors in the storage cell region, are positioned along the third line.

* * * * *